(12) United States Patent
Kwon et al.

(10) Patent No.: US 7,541,680 B2
(45) Date of Patent: Jun. 2, 2009

(54) SEMICONDUCTOR DEVICE PACKAGE

(75) Inventors: Heung-kyu Kwon, Seongnam-si (KR);
Se-nyun Kim, Cheonan-si (KR);
Tae-hun Kim, Asan-si (KR); Jeong-o Ha, Asan-si (KR); Hak-kyoon Byun, Asan-si (KR); Sung-yong Park, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 287 days.

(21) Appl. No.: 11/509,641

(22) Filed: Aug. 25, 2006

(65) Prior Publication Data

US 2007/0045828 A1 Mar. 1, 2007

(30) Foreign Application Priority Data

Aug. 26, 2005 (KR) .................... 10-2005-0078863

(51) Int. Cl.
*H01L 23/12* (2006.01)
*H01L 23/48* (2006.01)

(52) U.S. Cl. .................. 257/777; 257/723; 257/685; 257/686; 257/E25.006; 257/E25.013; 257/E25.027; 257/E23.085

(58) Field of Classification Search ............ 257/723, 257/777, 685, 686, E25.006, E25.013, E25.018, 257/E25.021, E25.027, E23.085, E21.614; 438/109, FOR. 368, FOR. 426

See application file for complete search history.

(56) References Cited

U.S. PATENT DOCUMENTS 6,979,905 B2 * 12/2005 Nishida et al. ............ 257/777

FOREIGN PATENT DOCUMENTS

| JP | 2001-257307 | 9/2001 |
| JP | 2004-235352 | 8/2004 |
| KR | 1020030048250 A | 6/2003 |

* cited by examiner

*Primary Examiner*—Jasmine J Clark
(74) *Attorney, Agent, or Firm*—Volentine & Whitt, PLLC

(57) ABSTRACT

Disclosed is a semiconductor device packaging technique that is capable of resolving a problem of instability of bonding wires when stacking a plurality of semiconductor chips. The technique is also capable of realizing a slim, light and small package. The semiconductor device package includes a substrate having a substrate pad on a surface thereof, one or more memory chips stacked on the substrate with each memory chip having a pad connected to a common pin receiving a common signal applied to all the memory chips, an interposer chip stacked on the substrate and having an interconnection wire connected to the memory chip pad, the common pin of each of the memory chips being electrically connected to the interconnection wire via the memory chip pad, and a logic chip stacked on the substrate and having a bypass circuit which electrically connects or disconnects the interconnection wire to or from the substrate pad.

9 Claims, 2 Drawing Sheets

SEMICONDUCTOR DEVICE PACKAGE

BACKGROUND OF THE INVENTION

1. Field of the Invention

Embodiments of the invention relate to a semiconductor device package and packaging technique. More particularly, embodiments of the invention relate to a semiconductor device packaging scheme adapted for use with a plurality of stacked semiconductor devices.

This application claims priority from Korean Patent Application No. 10-2005-0078863 filed on Aug. 26, 2005, the subject matter of which is herein incorporated by reference in its entirety.

2. Description of the Related Art

Semiconductor packaging technology is one of the key technologies for realizing slim, light and small electronic devices. A variety of types of semiconductor packages have evolved over time in order to realize ever increasing high density packaging, such as the dual inline package (DIP), the small outline package (SOP) and the ball grid array (BGA). A key issue with implementing high density electronics is that the area occupied by a semiconductor chip's package should be reduced when possible, which is often accomplished by reducing the width of the package's wires, the pitch of the package's external terminals and the size of the package's outer casing.

Another approach to realizing high density packaging includes the "multi-chip package", which refers to devices where multiple semiconductor chips are incorporated into a single package body. A variant of the multi-chip package is the "stacked-type multi-chip package" which refers to devices in which multiple semiconductor devices are sequentially stacked.

Two examples of multi-chip packaging schemes are known as the system-in-package (SIP), which refers to devices that include multiple semiconductor devices performing different functions in a single package body, and the system-on-chip (SOC), which refers to devices that incorporate memory, logic devices and analog circuitry in a single package body, thereby realizing a system in one package.

Unfortunately, the system-on-chip (SOC) technology has many problems. From the viewpoint of memory chips, it can be difficult to lower the power supply voltage beyond a certain point. From the viewpoint of the logic device, noise reduction is necessary. Further, when an SOC package includes both analog circuitry implemented via bipolar processes as well as memory and logic implemented through metal oxide semiconductor (MOS) processes, manufacturing using CMOS processes becomes difficult.

In light of the above-described problems, the SIP approach is attracting a lot of attention as an alternative to the SOC because SIPs can be developed in a short time and at low cost. Unfortunately, conventional semiconductor devices have been designed with no consideration for SIP products, especially from the viewpoint of pad arrangement. For instance, when mounting SIP devices on printed circuit board (PCBs), short circuits tend to form between adjacent bonding wires connecting the SIPs to PCBs, and routing can be difficult due to high circuit complexity.

In SIP devices that use a plurality of stacked semiconductor chips and that interconnect semiconductor chips with PCBs using wire bonding, the size of each sequentially stacked semiconductor chip becomes smaller from the lowermost to the uppermost semiconductor chips. This approach is used in order to prevent an upper semiconductor chip from interfering with a lower semiconductor chip. However, in situations where an upper semiconductor chip and a lower semiconductor chip have different sizes, the distance between chip pads for the upper chip and respective PCB substrate pads can increase in comparison to the lower chip. Unfortunately, due to this increase in bonding wire lengths, the bonding wire's strength is reduced and the wire can droop under its own weight.

Semiconductor chips enclosed in an SIP generally include a memory chip and a logic chip. In the case where the memory chip and analog-logic chips are stacked, the respective bonding wires for the memory chip and analog-logic chip can become tangled because analog-logic chips tend to have more pins than memory chips. Accordingly, there is the need for a solution to realize slim, light and small SIPs as well as to be able to allow direct access testing for each semiconductor chip in an SIP in order to ensure high reliability.

SUMMARY OF THE INVENTION

Accordingly, embodiments of the invention have been made keeping in mind the above problems occurring in the related art, and in various aspects embodiments of the invention provided a semiconductor device package capable of overcoming the problem bonding wire instability when stacking a plurality of semiconductor chips having a slim, light and small body, and capable of allowing each of the semiconductor devices therein to undergo a direct access test.

The objects and advantages of embodiments of the invention are not limited to the above description, but other objects and advantages will be appreciated by those skilled in the art from the following description.

According to an embodiment of the invention, there is provided a semiconductor device package including a substrate having substrate pads on a surface thereof, one or more semiconductor memory chips stacked on the substrate, each semiconductor memory chip having a memory chip pad connected to a common pin to which a common signal to be applied to all the semiconductor memory chips is applied, an interposer chip mounted on the substrate and having an interconnection wire connected to the memory chip pad, in which the common pin of each of the semiconductor memory chips is electrically connected to the interconnection wire via the memory chip pad, and an analog-logic chip having a bypass circuit which electrically connects the interconnection wire to the substrate pad or disconnects the interconnection wire from the substrate pad.

BRIEF DESCRIPTION OF THE DRAWINGS

The above and other objects, features and other advantages of embodiments of the invention will be more clearly understood from the following detailed description when taken in conjunction with the accompanying drawings. In the drawings, like reference numerals refer to like elements throughout the specification.

DESCRIPTION OF EMBODIMENTS

Advantages and features of embodiment of the invention and methods of accomplishing the same may be understood more readily with reference to the following detailed description and accompanying drawings. The invention may, however, be embodied in many different forms and should not be construed as being limited to the embodiments set forth herein. Rather, the described embodiments are presented as teaching examples.

Embodiments of the present invention will be described in more detail with reference to the accompanying drawings.

Figure 1A:
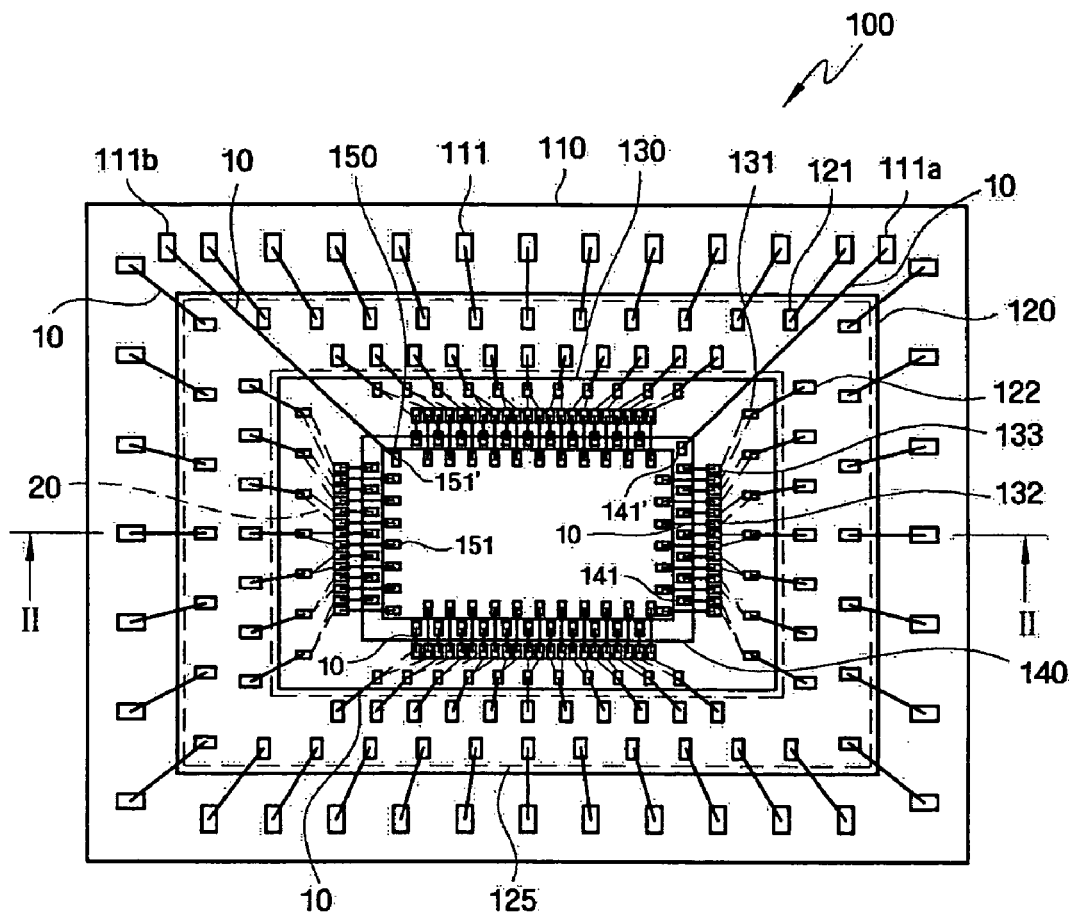
FIG. 1A is a top-down view illustrating a semiconductor device package according to one embodiment of the invention.
Figure 1B:
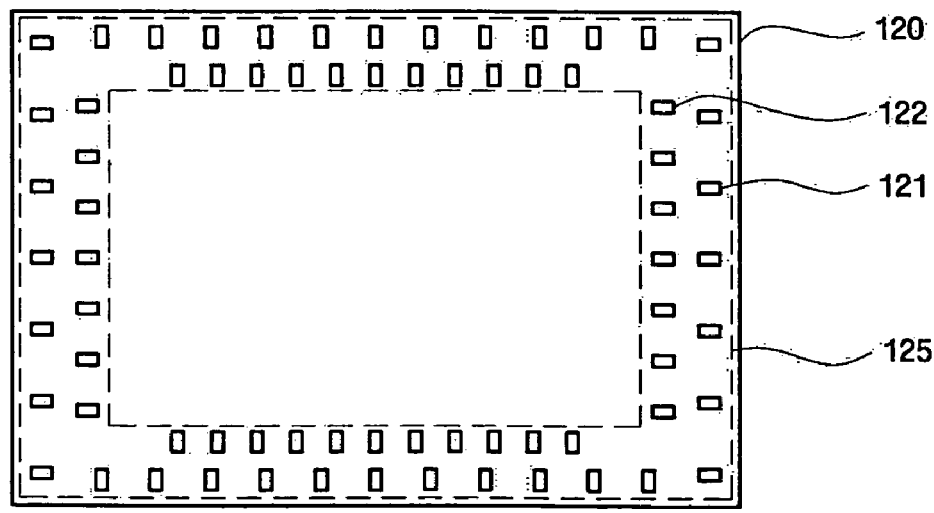
FIG. 1B is a top-down view illustrating an analog-logic chip having a bypass circuit in the semiconductor device package shown in FIG. 1A.
Figure 2:
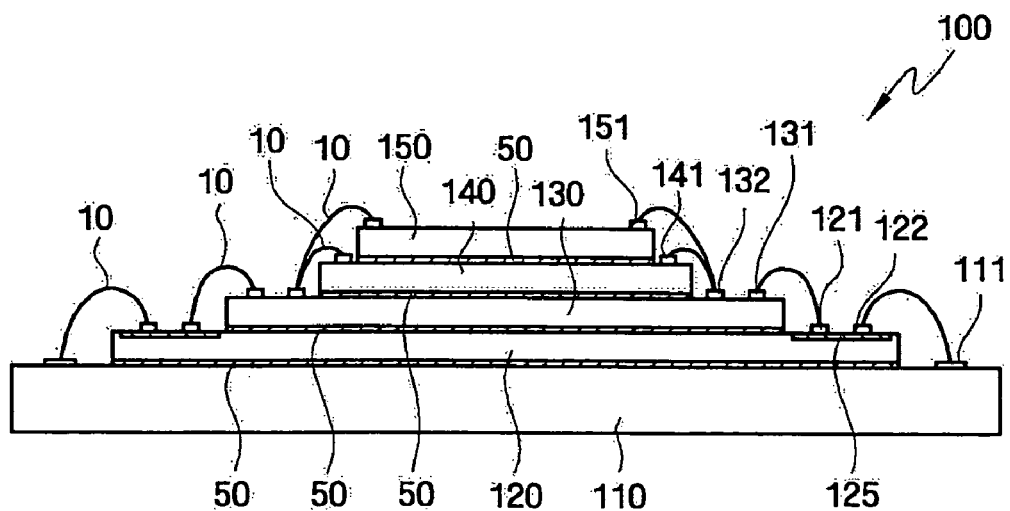
FIG. 2 is a cross-sectional view illustrating the semiconductor device package shown in FIG. 1A, the view taken along the line II-II'.

FIG. 1A is a top-down view of a semiconductor device package 100 according to an illustrative embodiment, FIG. 1B is a top-down view further illustrating an analog-logic chip 120 comprising a bypass circuit 125 in the semiconductor device package shown in FIG. 1A and FIG. 2 illustrates a cross-section view of the semiconductor device package 100 shown in FIG. 1A with the cross-section being taken along line II-II' in FIG. 1A.

Referring to FIG. 1A and FIG. 2, the semiconductor device package 100 includes a substrate 110 serving as a base for stacking semiconductor chips, an analog-logic chip 120, an interposer chip 130, a first memory chip 140 and a second memory chip 150 all of which are sequentially stacked. Each of the chips 120-150 can be attached to an adjacent chip by an adhesive layer 50. The analog-logic chip 120, the first memory chip 140 and the second memory chip 150 are semiconductor devices.

The substrate 110 can include an insulation layer or an inorganic thin plate with an interconnection wire layer formed thereon. The interconnection wire layer can include a substrate pad 111 to be connected to the common pins of the various semiconductor chips 120, 140 and 150. The substrate pad 111 is an electrode pad electrically connected to an external I/O electrode, which in turn can be connected to external devices and be used as a wire bonding pad. The exemplary substrate pad 111 can be electrically connected to the common pins of the analog-logic chip 120, the first memory chip 140 and the second memory chip 150 via a variety of traces. The substrate pad 111 can be also connected to an analog-logic chip pad 122 servicing the analog-logic chip 120 by a wire 10.

In various embodiments, the analog-logic chip 120 can include any combination of circuitry such that logical processes are implemented using analog circuitry in full or in part.

The interconnection wire layer on the substrate 110 further includes substrate pads 111a and 111b usable for applying a chip selection signal to the first and second memory chips 140 and 150. As shown in FIG. 1, substrate pad 111a is connected to a first memory chip pad 141' (which leads to a chip selection pin of the first memory chip 140) by a wire 10, and the substrate pad 111b is connected to a second memory chip pad 151' (which leads to a chip selection pin of the second memory chip 150) by a wire 10.

The inorganic thin plate of the substrate 110 can be made of resin film, a glass fiber base impregnated with resin and/or a ceramic, and the substrate 110 can be used in lead frame packages and ball grid array packages.

The analog-logic chip 120 includes an interconnection wire (not shown) formed on a surface thereof, a common pin (not shown) connected to the interconnection wire, an independent pin (not shown) connected to the interconnection wire, a bypass circuit 125 connected to the interconnection wire and analog-logic chip pads 121 and 122 arranged along an edge portion thereof and connected to the bypass circuit 125.

The interconnection wire of the analog-logic chip 120 may include circuit devices such as transistors formed on a silicon substrate. The common pin may be a data pin and/or an address pin, and the independent pin can be a power supply voltage pin or a ground voltage pin. In general, since an analog-logic chip has more pins than a memory chip, the analog-logic chip can be the lowermost device in order to facilitate easy bonding.

The analog-logic chip pads 121 and 122 are external I/O electrode pads for connecting the analog-logic chip 120 to external devices, and can be used as bonding pads for wire bonding. The analog-logic chip pads 121 and 122 are electrically connected to the bypass circuit 125. The analog-logic chip pad 121 can be connected to the substrate pad 111 of the substrate 110 by a wire 10, and the analog-logic chip pad 122 can be connected to the bonding pad 131 of the interposer chip 130 by a wire 10.

The exemplary analog-logic chip 120 includes the bypass circuit 125 and the analog-logic circuits. The bypass circuit 125 can be electrically connected to the common pin of the analog-logic chip 120. The bypass circuit 125 can be provided to allow the semiconductor chips 120, 140 and 150 in the package 100 to separately undergo direct access testing and to select the analog-logic chip 120 for testing. That is, when testing the analog-logic chip 120 with a direct access test, the bypass circuit 125 can disconnect the analog-logic chip pad 121 from the analog-logic chip pad 122, and can connect the analog-logic chip pad 121 to the common pin of the analog-logic chip 120. When performing a direct access test of the first memory chip 140 or the second memory chip 150, the bypass circuit 125 can disconnect the analog-logic chip pad 121 from the common pin of the analog-logic chip 120, and connect the analog-logic chip pad 121 to the analog-logic chip pad 122. Further, during normal operation of the semiconductor chips 120, 140 and 150, in the case in which the same signal can be applied to the common pins of the semiconductor chips 120, 140 and 150, the bypass circuit 125 can connect all of the analog-logic chips pads 121 and 122 and the common pin of the analog-logic chip 120.

The operation of the bypass circuit 125 and the direct access test will be understood in greater detail from the following description.

Even though the independent pin of the analog-logic chip 120 is not illustrated in the drawings, the independent pin can be indirectly connected to the substrate pad via the interposer chip 130 or can be directly connected to the substrate pad by a wire.

The interconnection wire layer of the analog-logic chip 120, other than at the chip pads 121 and 122, can be protected by an insulation layer formed of SiN or polyimide.

The first memory chip 140 includes an interconnection wire (not shown) formed on a surface thereof, a common pin (not shown) connected to the interconnection wire, an independent pin (not shown) connected to the interconnection wire, and first memory chip pads 141 and 141' formed thereon along an edge thereof.

The interconnection wire of the first memory chip 140 may form functional devices (circuit devices) such as transistors on a silicon substrate. The first memory chip 140 can include any number of memory circuits. The common pin can be a data pin and/or an address pin of the functional device, and the independent pin can be a power supply voltage pin, a ground voltage pin or a chip selection pin.

The first memory chip pads 141 and 141' are external I/O electrode pads for connecting the first memory chip 140 to external devices, and can be used as bonding pads for wire bonding. The first memory chip pad 141 can be electrically connected to the common pin of the first memory chip 140 and can be connected to a bonding pad 133 of the interposer chip 130 by a wire 10. The first memory chip pad 141' can be electrically connected to the chip selection pin of the first memory chip 140 and can be electrically connected to the substrate pad 111a of the substrate 110. In the embodiment shown in FIG. 1A and FIG. 2, the first memory chip pad 141' can be directly connected to the substrate pad 111a by a wire 10, but the present invention is not limited to this structure. That is, in various embodiments the first memory chip pad 141' can be indirectly connected to the substrate pad 111a via the interconnection wire of the interposer chip 130. Even though the independent pins (except for the chip selection pin) are not shown, as with the chip selection pin the independent pins can be directly or indirectly connected to the substrate pad by a wire or via the interconnection wire of the interposer chip 130.

Note that in various embodiments, the interconnection wire layer of the first memory chip 140, except for the device pads 141 and 141', can be protected by an insulation layer formed of SiN or polyimide.

The second memory chip 150 can include an interconnection wire (not shown) formed on a surface thereof, a common pin (not shown) connected to the interconnection wire, an independent pin (not shown) connected to the interconnection wire and a number of second memory chip pads 151 and 151' formed thereon and along an edge thereof.

The interconnection wire of the second memory chip 150 may form functional devices (circuit devices) such as transistors on a silicon substrate. As with the first memory device 140, the second memory chip 150 can include any number of memory circuits. The common pin can be a data pin and/or an address pin of the functional device, and the independent pin can be a power supply voltage pin, a ground voltage pin or a chip selection pin.

The device pads 151 and 151' of the second memory chip 150 are external I/O electrode pads for connecting the second memory chip 150 to external devices and can be used as bonding pads for wire bonding. The device pad 151 of the second memory chip 150 can be electrically connected to the common pin of the second memory chip 150 and can be connected to the bonding pad 132 of the interposer chip 130 by a wire 10. The device pad 151' of the second memory chip 150 can be electrically connected to the chip selection pin of the second memory chip 150 and can be electrically connected to the substrate pad 111b of the substrate 110. In the embodiment shown in FIG. 1A and FIG. 2, the second memory chip pad 151' can be directly connected to the substrate pad 111b by a wire 10, but the present invention is not limited to this structure. That is, in various embodiments the second memory chip pad 151' can be indirectly connected to the substrate pad 111b via the interconnection wire of the interposer chip 130. Even though the independent pins, other than at the chip selection pin are not shown, as with the chip selection pin the independent pins can be directly or indirectly connected to the substrate pad by a wire or via the interconnection wire of the interposer chip 130.

The interconnection wire layer of the second memory chip 150, except for the device pads 151 and 151', can be preferably protected by an insulation layer formed of SiN or polyimide.

The interposer chip 130 can be a dummy semiconductor chip made by a wafer. The term "dummy semiconductor chip" refers to a semiconductor chip having no functional devices therein. The interposer chip 130 can be made of a flexible printed circuit board (FBC) or a printed circuit board (PCB).

The interposer chip 130 has an interconnection wire that can be a single-layered structure or a multi-layered structure. The interconnection wire can include a first bonding pad 131, a second bonding pad 132, a third bonding pad 133 and a wire pattern 20.

The first bonding pad 131 can be connected to the analog-logic chip pad 122 of the analog-logic chip 120 by a wire 10. Similarly, the second bonding pad 132 can be connected to the second memory chip pad 151 of the second memory chip 150 by a wire 10, and the third bonding pad 133 can be connected to the first memory chip pad 141 of the first memory chip 140 by a wire 10.

According to particular embodiments of the present invention, since the analog-logic chip 120, the interposer chip 130, the first memory chip 140 and the second memory chip 150 are sequentially stacked on the substrate 110, the first bonding pad 131 can be disposed near the analog-logic chip 120, and the second and third bonding pads 132 and 133 can be placed nearer the first memory chip 140 than is the first bonding pad 131.

Continuing, the wire pattern 20 electrically connects the first bonding pad 131, the second bonding pad 132 and the third bonding pad 133. Accordingly, the common pin of the first memory chip 140 can be electrically connected to the first bonding pad 131 via the first memory chip pad 141, the third bonding pad 133 and the wire pattern 20. The common pin of the second memory chip 150 can be electrically connected to the first bonding pad 131 via the second memory chip pad 151, the second bonding pad 132 and the wire pattern 20. Accordingly, (1) the common pins of the first and second memory chips 140 and 150 can be connected to the interconnection wire of the interposer chip 130, (2) the interconnection wire of the interposer chip 130 can be connected to the bypass circuit 125 of the analog-logic chip 120, and (3) the bypass circuit 125 of the analog-logic chip 120 can be finally connected to the substrate pad 112 of the substrate 110.

In a conventional stacked-type semiconductor device package, since data and address pins of semiconductor chips are separately wired to the substrate by a wire bonding method, wires and substrate pads should be configured in the same order as the data and address pins. However, there may be many problems in realizing slim, light and small packages, such as a tendency for wires to droop due to excessive wire length, short circuits where wire density is high and situations where large areas are consumed by substrate pads.

In contrast, the semiconductor device packages according to an embodiment of the invention have a reduced number of wires (compared to the conventional packages) since common pins for receiving the common signals for memory chips can be gathered in an interposer chip, common pins of an analog-logic chip and the interposer chip can be connected in a bypass circuit, and the bypass circuit and a substrate can be electrically connected. Since memory chips are electrically connected to the substrate via the interposer chip, wire lengths are prevented from increasing. Further, because the common pins of the semiconductor chips are combined into one pad connected to the substrate, the number of substrate pads can be reduced. As a result, it is possible to realize a slim, light and small package.

Returning to FIG. 1A, the configuration of the interconnection wire of the interposer chip 130 is not limited to the above described structure. For example, by directly wiring the wire pattern of the interposer chip 130, the interconnection wire may not have bonding pads. Further, the interconnection wire may include only the bonding pads with a plurality of bonding wires wired to the bonding pads.

Bonding pad 131 can be arranged along around an outer edge of the interposer chip 130 while bonding pads 132 and 133 are arranged along around an outer edge of the first memory chip 140. The wire patterns 20 are connected to the first bonding pad 131, second bonding pad 132 and third bonding pad 133 so that they do not cross each other. The interconnection wire, other than at the bonding pads 131, 132 and 133, can be covered with an insulation layer.

As described above, the interposer chip 130 can be made of a wafer, an FPC or a PCB. The interposer chip 130 can be made of a wafer having the same material and structure as a wafer used for manufacturing the analog-logic chip 120 or the memory chips 140 and 150. The bonding pads 131, 132 and 133 and the wire pattern 20 on the interposer chip 130 can be formed by the processes used for manufacturing the analog-logic chip 120 or the memory chips 140 and 150. That is, since the interposer chip 130 can be manufactured using the same materials and manufacturing apparatus as those of the analog-logic chip 120 or the memory chips 140 and 150, the interposer chip 130 can be manufactured at low cost and in a short time. Further, the pitch of the interconnection wires can be 1 micrometer or less since a pitch of patterns on the various chips 120, 140 and 150 is 1 micrometers or less.

The bonding wire 10 used in embodiments of the present invention can be made of gold, gold alloy, aluminum or aluminum alloy, and wire bonding can be performed by a method such as capillary bonding, ball bonding or wedge bonding.

Hereinafter, the test for semiconductor device packages according to the present invention will be described.

First, when applying the same signal to the common pins of the semiconductor chips 120, 140 and 150, the bypass circuit 125 can connect all of the pads 121 and 122 and the common pin of the analog-logic chip 120. Accordingly, the common pin of the analog-logic chip 120, the common pin of the first memory chip 140 and the common pin of the second memory chip 150 can be connected to the substrate pad 111 of the substrate 110 via the bypass circuit 125, so that the same signal can be applied to the common pins of the semiconductor chips 120, 140 and 150 via the same substrate pad 111.

In order to test the characteristics of the semiconductor chips 120, 130 and 140, a direct access test can be performed. As described above, when performing a direct access test on the analog-logic chip 120, the analog-logic chip pad 121 and the analog-logic chip pad 122 can be electrically disconnected by the bypass circuit 125 while the analog-logic chip pad 121 and the common pin of the analog-logic chip 120 are connected. Accordingly, since the substrate pad 111 can be brought into connection only with the common pin of the analog-logic chip 120, the direct assess test can be performed only on the analog-logic chip 120.

When performing a direct access test on the first memory chip 140, the analog-logic chip pad 121 and the common pad of the analog-logic chip 120 can be disconnected, and the analog-logic chip pad 121 and the analog-logic chip pad 122 can be connected by the bypass circuit 125. Next, a high impedance signal can be applied to the chip selection pin connected to the second memory chip pad 151', via the substrate pad 111b, resulting in a floating state of the second memory chip 150. Then, if a test signal is applied to the substrate pad 111, the testing can be performed only on the first memory chip 140.

In the same way, when performing a direct access testing on the second memory chip 150, the bypass circuit 125 can disconnect a connection between the analog-logic chip pad 121 and the common pin of the analog-logic chip 120 and connect the analog-logic chip pad 121 to the analog-logic chip pad 122. Next, a high impedance signal can be applied to the chip selection pin connected to the first memory chip pad 141' resulting in the floating state of the first memory chip 140. Then, a test signal is applied to the substrate pad 111, and a test can be performed only on the second memory chip 150.

Figure 3:
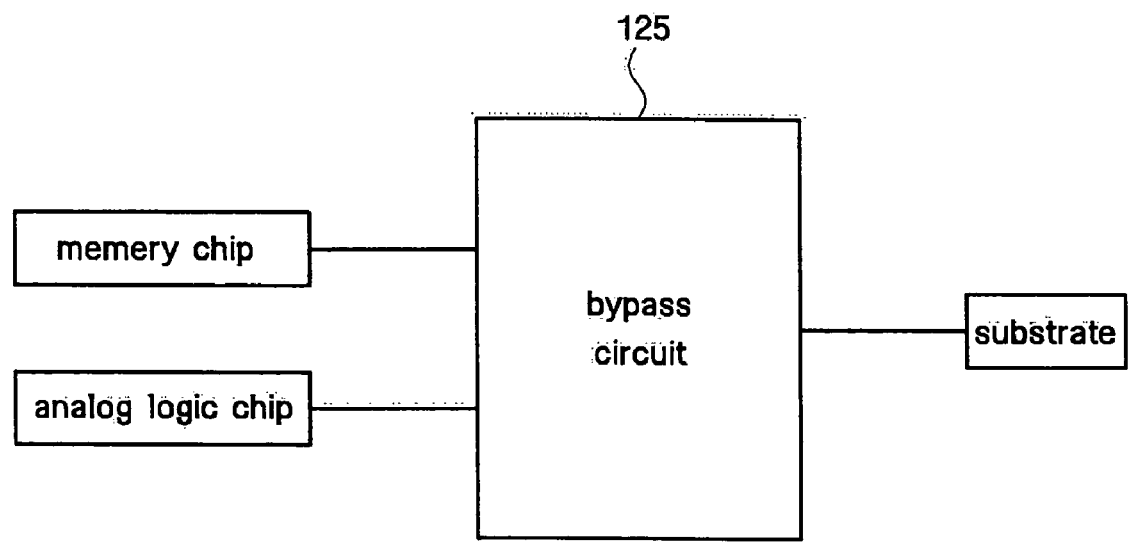
FIG. 3 is a schematic block diagram illustrating roles of a bypass circuit for testing individual semiconductor devices.

FIG. 3 schematically illustrates a block diagram of a bypass circuit 125 for testing semiconductor chips in the package according to the present invention. Referring to FIG. 3, the bypass circuit 125 is connected to substrate 110, one or more memory chips 130A and an analog-logic chip 120. If the same signal is applied to the memory chips 130A and the analog-logic chip 120, the substrate 110, the memory chips 130A and the analog-logic chip 120 are connected via the bypass circuit 125. Accordingly, when performing a direct access test on the memory chips 130A, the analog-logic chip 120 can be disconnected while the substrate 110 and the memory chips 130A are connected by the bypass circuit 125. Conversely, when performing a direct access test on the analog-logic chip 120, the memory chips 130A can be disconnected by the bypass circuit 125 while the substrate 110 and the analog-logic chip 120 are connected to each other.

As such, the semiconductor device package 100 according to the embodiment of the present invention combines the common pins of the memory chips 140 and 150 into the interconnection wire on the interposer chip 130, and electrically connects the interconnection wire of the interposer chip 130 to the substrate pad 111 via the bypass circuit 125 of the analog-logic chip 120, thereby realizing a slim, light and small package. Moreover, the package 100 can broaden the application range of the direct access test used for ensuring the reliability of the semiconductor device package 100. Further, since the semiconductor device package 100 can use direct access testing (which is typically used to test one-chip package) the cost of testing the package 100 will not increase relative to testing one-chip devices.

Further, according to the embodiment of the present invention, the semiconductor device package 100 may have a tolerant I/O electrode that makes an analog-logic chip in the package endure a burn-in test.

As described above, the semiconductor device package according to embodiments of the invention can have a number of advantages. For example, it is possible to resolve instability of bonding wires in the case of stacking a plurality of semiconductor devices in order to realize a slim, light and small package, and to allow a direct access test to be separately performed for each of the semiconductor chips enclosed in a package.

While the present invention has been shown and described with reference to exemplary embodiments thereof, it will be understood by those of ordinary skill in the art that various changes in form and details may be made therein without departing from the spirit and scope of the present invention as defined by the following claims. Therefore, it is to be understood that the above-described embodiments have been provided only in a descriptive sense and should not be construed as placing any limitation on the scope of the invention.

What is claimed is:

1. A semiconductor device package comprising:
 a substrate having a surface and a substrate pad thereon;
 a memory chip stacked on the substrate and having a memory chip pad connected to a common pin receiving a common memory chip signal;
 an interposer chip stacked between the substrate and the memory chip having an interposer pad connected to the memory chip pad; and a secondary chip stacked between the substrate and the interposer chip and having a common pin;

a bypass circuit having switching circuits;

a first analog logic pin connected between the substrate pad and the bypass circuit; and a second analog-logic pin connected between the bypass circuit and the interposer pad, wherein during a direct access test of the secondary chip, the switching circuits of the bypass circuit are configured to disconnect the first analog-logic pin from the second analog-logic pin, and connect the first analog-logic pin to the common pin; and during a direct access test of the memory chip, the switching circuit of the bypass circuit are configured to disconnect the common pin from the first analog-logic pin and connect the first and second analog-logic pins.

2. The semiconductor device package of claim 1, wherein the secondary chip is an analog-logic chip.

3. The semiconductor device package of claim 1, wherein the memory chip comprises a chip selection pin receiving a chip selection signal enabling the direct access test of the memory chip.

4. The semiconductor device package of claim 3, wherein the chip selection pin is electrically connected to a chip selection signal pad disposed on the substrate.

5. The semiconductor device package of claim 3, wherein a high impedance signal is applied to the chip selection pin of the memory chip during the direct access test.

6. The semiconductor device package of claim 1, wherein the interposer chip is manufactured using a wafer, a flexible printed circuit board or a printed circuit board.

7. The semiconductor device package of claim 2, wherein the substrate, the analog-logic chip, the interposer chip and the memory chip are sequentially stacked.

8. The semiconductor device package of claim 1, wherein the common pin is a data pin and/or an address pin.

9. The semiconductor device package of claim 1, wherein the interposer chip is a dummy semiconductor chip.

* * * * *